US011461252B2

(12) United States Patent
Mazzucchelli (10) Patent No.: US 11,461,252 B2
(45) Date of Patent: Oct. 4, 2022

(54) REDUNDANCY RESOURCE COMPARATOR FOR A BUS ARCHITECTURE, BUS ARCHITECTURE FOR A MEMORY DEVICE IMPLEMENTING AN IMPROVED COMPARISON METHOD AND CORRESPONDING COMPARISON METHOD

(71) Applicant: SK hynix Inc., Gyeonggi-do (KR)

(72) Inventor: Simone Mazzucchelli, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/338,291

(22) Filed: Jun. 3, 2021

(65) Prior Publication Data

US 2022/0012191 A1 Jan. 13, 2022

(30) Foreign Application Priority Data

Jul. 7, 2020 (IT) .......................... 102020000016441

(51) Int. Cl.
*G06F 13/00* (2006.01)
*G06F 13/16* (2006.01)
*G06F 12/02* (2006.01)
*G06F 13/362* (2006.01)

(52) U.S. Cl.
CPC ...... *G06F 13/1668* (2013.01); *G06F 12/0246* (2013.01); *G06F 13/1631* (2013.01); *G06F 13/362* (2013.01)

(58) Field of Classification Search
CPC ............ G06F 13/1668; G06F 13/1631; G06F 13/362; G06F 13/00; G06F 12/00; G06F 12/0246
See application file for complete search history.

(56) References Cited

U.S. PATENT DOCUMENTS

| | | | |
|---|---|---|---|
| 2001/0043507 A1 | 11/2001 | Ooishi | |
| 2009/0235057 A1* | 9/2009 | Fujisawa | ............. G06F 12/0895 711/E12.017 |
| 2014/0029363 A1 | 1/2014 | Lim | |
| 2014/0169059 A1 | 6/2014 | Kong et al. | |
| 2014/0337573 A1 | 11/2014 | Chai et al. | |
| 2016/0011977 A1* | 1/2016 | Zhang | ....................... G06F 9/38 711/141 |
| 2020/0274549 A1* | 8/2020 | Sung | .................... H03M 7/3059 |

FOREIGN PATENT DOCUMENTS

| KR | 10-2014-0013695 A | 2/2014 |
|---|---|---|
| KR | 10-1944936 B1 | 2/2019 |

* cited by examiner

*Primary Examiner* — Tuan V Thai
(74) *Attorney, Agent, or Firm* — IP & T Group LLP (57) ABSTRACT

Disclosed herein is a redundancy resource comparator for a bus architecture of a memory device for comparing an address signal being received from an address signal bus and a redundancy address being stored in a latch of the memory device. Disclosed is also a corresponding bus architecture and comparison method.

15 Claims, 11 Drawing Sheets

REDUNDANCY RESOURCE COMPARATOR FOR A BUS ARCHITECTURE, BUS ARCHITECTURE FOR A MEMORY DEVICE IMPLEMENTING AN IMPROVED COMPARISON METHOD AND CORRESPONDING COMPARISON METHOD

CROSS-REFERENCE TO RELATED APPLICATION

The present application claims priority under 35 U.S.C. § 119(a) to Italian patent application number 102020000016441, filed on Jul. 7, 2020, which is incorporated herein by reference in its entirety.

BACKGROUND

Field of Invention

The present disclosure relates to redundancy resource comparator for a bus architecture, a bus architecture for a memory device implementing an improved comparison method and a corresponding comparison method.

Description of Related Art

In a computer or memory device, a bus is a communication system that transfers data between components. Buses can be parallel buses, which carry data words in parallel on multiple wires.

A memory device usually comprises different buses for different specific actions. In particular, it is well known to provide a memory device with a bus architecture specifically used to compare an address signal with a prestored redundancy signal in order to verify the signal to be provided as an input signal for the memory cell array of the memory device.

Figure 1:
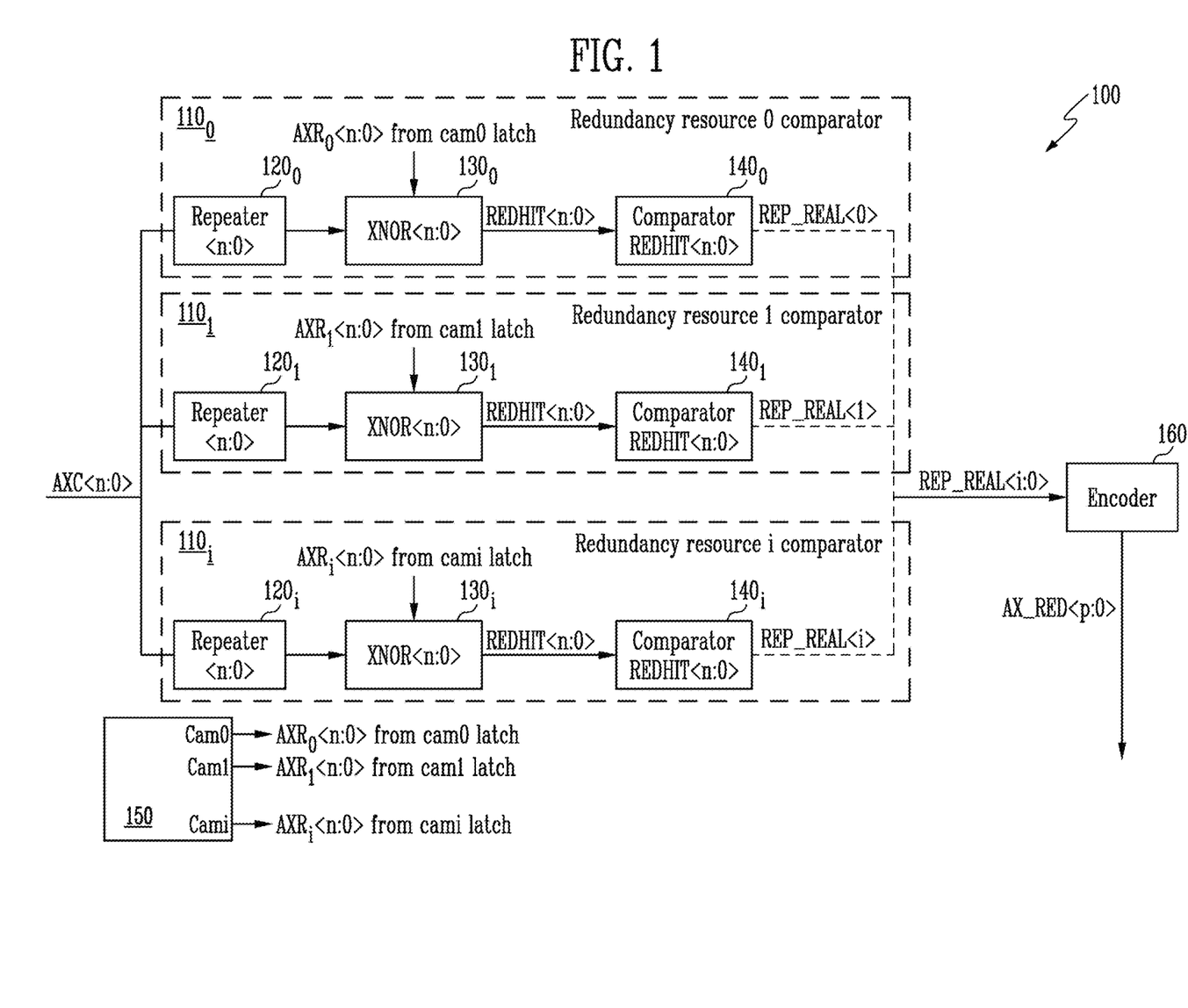
FIG. 1 shows a bus architecture for redundancy address comparison.

FIG. 1 shows a bus architecture for redundancy address comparison realised according to the prior art.

The redundancy address comparison bus architecture 100 comprises i number of redundancy resources comparators 110$_0$, 110$_1$, ..., 110$_i$, each redundancy resource comparator 110 comparing all n+1 bits of two address buses, namely an address signal AXC<n:0>, in particular a counter signal, from a linear address counter and a redundancy address AXR<n:0> stored inside a latch 150 of the memory device.

More particularly, the redundancy resource comparators 110$_0$, 110$_1$, ..., 110$_i$ comprise respective repeaters 120$_0$, 120$_1$, ..., 120$_i$ each having an input connected to the address signal AXC bus and an output providing a repeated address signal AXC_REP<n:0> (corresponding to the address signal AXC) to respective comparator blocks 130$_0$, 130$_1$, ..., 130$_i$ also receiving the redundancy address AXR from the latch 150 and providing at an output terminal an output result signal REDHIT<n:0>, which goes high when an address signal AXC bit and a corresponding redundancy address AXR bit have the same value.

In this way, all bits of the result signal REDHIT<n:0> go high when the address signal AXC<n:0>, and thus the repeated address signal AXC_REP<n:0>, matches the redundancy address AXR<n:0>.

The redundancy resource comparators 110$_0$, 110$_1$, ..., 110$_i$ further comprise respective output comparator blocks 140$_0$, 140$_1$, ..., 140$_i$, receiving the output result signal REDHIT<n:0> and providing respective final signal bits REP_REAL <0>, REP_REAL <1> ... REP_REAL <n> which go high when all bits of the corresponding result signal REDHIT<n:0> go high.

The different final signal bits REP_REAL <0>, REP_REAL <1> ..., REP_REAL <i> compose a final signal REP_REAL <i:0>, which is provided to a common encoder block 160 in turn providing a binary code address AX_RED<p:0>.

In essence, in the known architecture 100 shown in FIG. 1, each redundancy resource comparator 110 compares the whole address bus during a column counting phase even in the worst scenario wherein only one redundancy address bit matches, mismatching not being taken into account. It is thus immediate to verify that such a bus architecture has a power consumption for all column counting phases and thus a total average power consumption which is high.

Figure 2A:
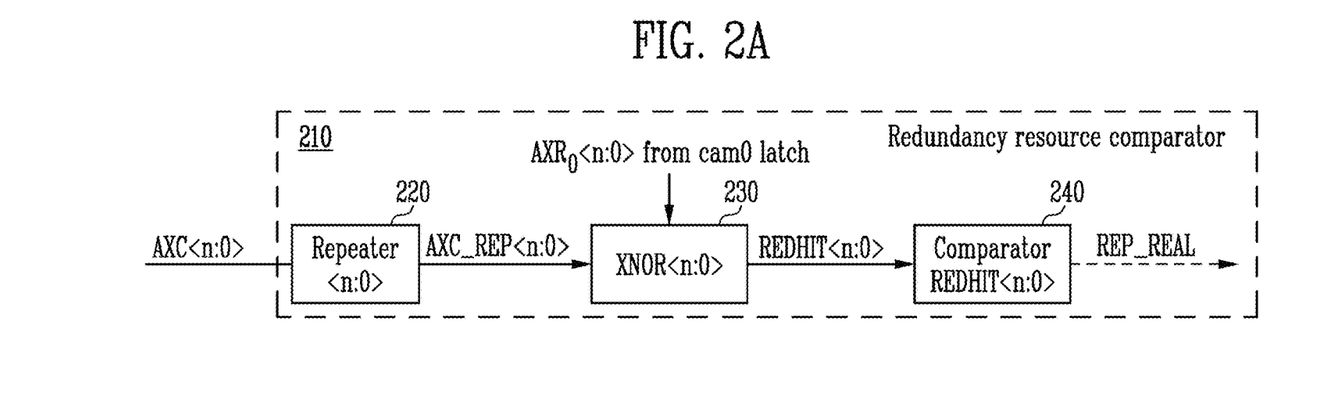
FIGS. 2A-2B show a portion of the bus architecture of FIG. 1 and its internal signals, respectively.

In particular, considering the working of a single redundancy resource comparator 210 as shown in FIG. 2A, it is clear that, since the address signal AXC<n:0> comes from linear counter (0→1→2→ ... ) the lowest significant bits of the address signal AXC<n:0> bus have the highest switching activity.

Figure 2B:
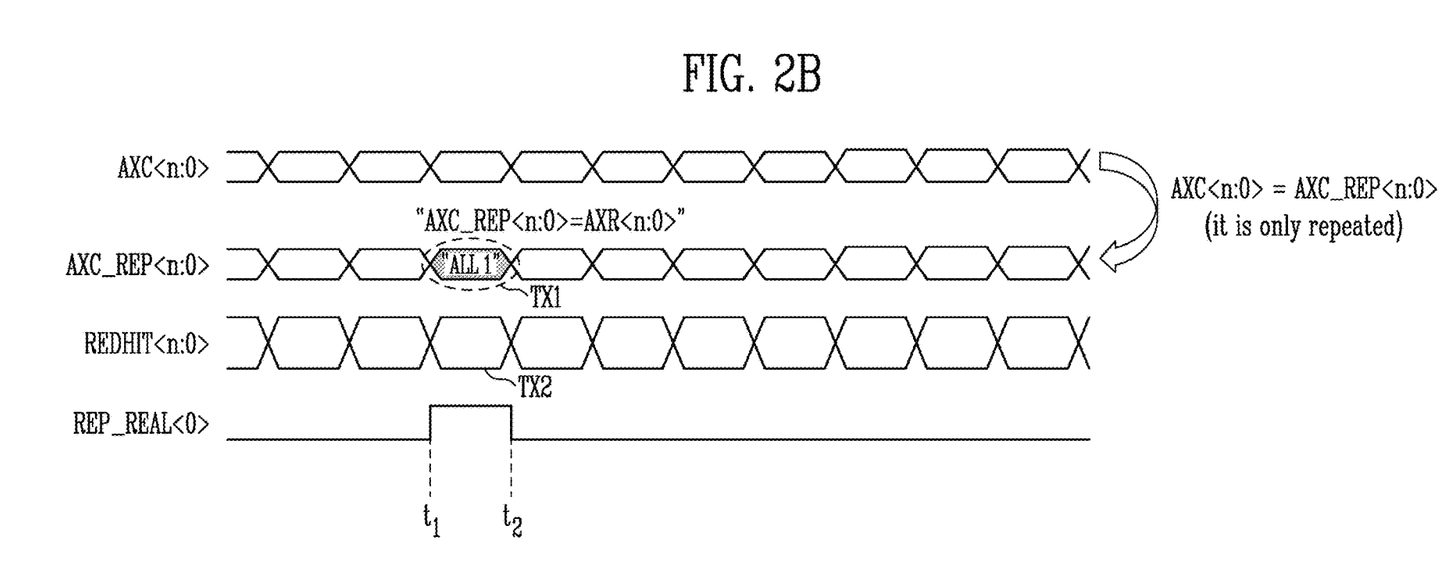

As indicated in FIG. 2B, when the repeated address signal AXC<n:0> matches the redundancy address AXR<n:0> (AXC_REP<n:0>=AXR<n:0>) at a first transaction TX1, the result signal REDHIT<n:0> goes high at a second transaction TX2 and the corresponding final signal bit REP_REAL <0> goes high during the transaction interval between t1 and t2.

The current consumption Id of the redundancy resource comparator 210 can be approximately calculated as:

$$Id = CVf0 + CVf1 + CVf2 + CVf3 + CVf4 + CVf5 + \ldots + CVfn \rightarrow (1 + 1/2 + 1/4 + 1/8 + 1/16 + 1/32 + \ldots + 1/2n)CVf0,$$

where

C is the total capacitance load for one bit path address signal AXC;

V is the power voltage of the comparator architecture circuit; and f0, f1, ..., fn are the frequency of the bits of the address signal AXC<n:0>.

The current consumption Id, as n increases, approaches a final value equal to 2CVf0, i.e. it is tied to the frequency of the lowest significant bit of the counter signal AXC<0>.

Consequently, a standard bus architecture as the one shown in FIG. 1 involves a huge current consumption and it will require a huge current consumption in the future as well.

SUMMARY

Various embodiments of the present invention are directed to a redundancy resource comparator and a bus architecture for a memory device implementing an improved comparison method between an address signal and a prestored redundancy signal.

The aim of the proposed bus architecture is to avoid unnecessary power consumption made until an operation of comparing all bits is completed even when portions of the bits do not match each other. In this aim, the bus architecture provides an input signal to a redundancy address of a memory architecture based on the comparison between an address signal and a prestored redundancy signal.

More particularly, the proposed bus architecture is able to interrupt a comparison operation between different signals when at least portion of the bits of the compared signals do not match each other. In this aim, in the proposed bus architecture, a portion of the bits of the address signal and a portion of the bits of the redundancy signal are compared against each other, and the remaining bits are compared in response to an enable signal generated when, as a result of first comparison, the corresponding bit portions match each other.

In an embodiment of the present invention, provided is a redundancy resource comparator for a bus architecture of a memory device for comparing an address signal from an address signal bus and a redundancy address stored in the memory device, the redundancy resource comparator comprising: a first resource block configured to receive a first portion of bits of the address signal and a first portion of bits of the redundancy address; a second resource block configured to receive a second portion of bits of the address signal and a second portion of bits of the redundancy address; and a further comparator configured to provide an enable signal to the second resource block in response to a first partial output result signal from the first resource block, wherein the first resource block includes: a repeater configured to receive a first portion of bits of a repeated address signal corresponding to the first portion of bits of the address signal; and a comparator block configured to provide a first partial output result signal corresponding to a comparing result of the first portion of bits of the repeated address signal and the first portion of bits of the redundancy address, wherein the second resource block includes: an enabling and repeater block configured to provide a second portion of bits of a repeated address signal corresponding to second portion of bits of the address signal in response to the enable signal; and a comparator block configured to provide a second partial output result signal corresponding to a comparing result of the second portion of bits of the repeated address signal and the second portion of bits of the redundancy address, wherein the first partial output result signal goes high when the bits of the first portion of the address signal and the corresponding bits of the first portion of the redundancy address have the same value, and wherein the second partial output result signal goes high when the bits of the second portion of the address signal and the corresponding bits of the second portion of the redundancy address have the same value.

According to another embodiment of the present invention, provided is a redundancy address comparison bus architecture for a memory device comparing an address signal from an address signal bus and a redundancy address stored in the memory device, the bus architecture including i number of redundancy resources comparators, each redundancy resource comparator comprising: a first resource block, receiving a first portion of bits of the address signal and a first portion of bits of the redundancy address and including: a repeater receiving the first portion of bits of the address signal and providing a first portion of bits of a repeated address signal, corresponding to the first portion of bits of the address signal, and a comparator block receiving the first portion of bits of the repeated address signal and the first portion of bits of the redundancy address and providing a first partial output result signal, wherein the first partial output result signal goes high when the bits of the first portion of the address signal and the corresponding bits of the first portion of the redundancy address have the same value; a second resource block receiving a second portion of bits of the address signal and a second portion of bits of the redundancy address, the second resource block including: an enabling and repeater block receiving the second portion of bits of the address signal and an enable signal and providing a second portion of bits of a repeated address signal, corresponding to second portion of bits of the address signal, when the enable signal goes high, and a comparator block receiving the second portion of bits of the repeated address signal and the second portion of bits of the redundancy address and providing a second partial output result signal, wherein the second partial output result signal goes high when the bits of the second portion of the address signal and the corresponding bits of the second portion of the redundancy address have the same value; and a further comparator receiving the first partial output result signal from the first resource block and providing the enable signal to the second resource block, the enable signal going high when the bits of the first portion of the address signal and the corresponding bits of the first portion of the redundancy address have the same value.

According to a further embodiment of the present invention, a method for comparing an address signal and a redundancy address comprises the following steps: subdividing the address signal and the redundancy address into respective first portion of bits and second portion of bits; comparing a first portion of bits of the address signal with a first portion of bits of the redundancy address and generating an enable signal when all bits of the first portion of bits of the address signal and all bits of the first portion of bits of the redundancy address match each other; and comparing a second portion of bits of the address signal and a second portion of bits of the redundancy address when the enable signal goes high.

According to another embodiment of the present invention, a circuit for a memory device may include an address signal bus; a latch configured to store a redundancy address; a first resource block configured to receive a first portion of bits of an address signal from the address signal bus and a first portion of bits of the redundancy address, compare the first portion of bits of the address signal with the first portion of bits of the redundancy address, and generate a first output result signal based on the comparison result; a first comparator configured to receive the first output result signal and generate an enable signal when the first output result signal indicates that the first portion of bits of the address signal matches with the first portion of bits of the redundancy address; a second resource block configured to receive a second portion of bits of the address signal and a second portion of bits of the redundancy address, compare the second portion of bits of the address signal with the second portion of bits of the redundancy address in response to the enable signal, and generate a second output result signal based on the comparison result; a second comparator configured to receive the first output result signal and the second output result signal, compare all bits of the address signal with all bits of the redundancy address based on the first output result signal and the second output result signal, and generate a final result signal when all bits of the address signal match with all bits of the redundancy address; and an encoder configured to receive the final result signal and generate a binary code address based on the final result signal.

BRIEF DESCRIPTION OF THE DRAWINGS

The characteristics and advantages of the present disclosure will be apparent from the following description of embodiments thereof given by way of indicative and not limiting examples with reference to the annexed drawings, in which.

DETAILED DESCRIPTION

Various embodiments of the present invention will be described in detail below with reference to the accompanying drawings. While the present invention is shown and described in connection with various embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, terms should be construed as having a meaning and concepts for complying with the technical idea of the present invention. In addition, detailed descriptions of constructions being well known in the art may be omitted to avoid unnecessarily obscuring the clarity of the present invention.

In the drawings, corresponding features are identified by the same reference numerals.

As timing performances increase, faster and faster address counting is needed and power consumption related to redundancy resource comparator increases. Moreover, since the number of redundancy resources relates to the page size; increasing page size increases the number of redundancy resource comparators and thus the total average power consumption of the bus architecture.

Various methods for comparing addresses in a memory device are understood by those skilled in the art, such as those described by KR 2014-0013695 which includes a method and circuit for sequentially comparing bits of a comparison address and a bits of a fail address with each other and KR 10-1944936 which includes a redundancy control circuit wherein that a fail address and a column input address are compared against each other, the collective subject matter of which is hereby incorporated by reference in its entirety.

Figure 3A:
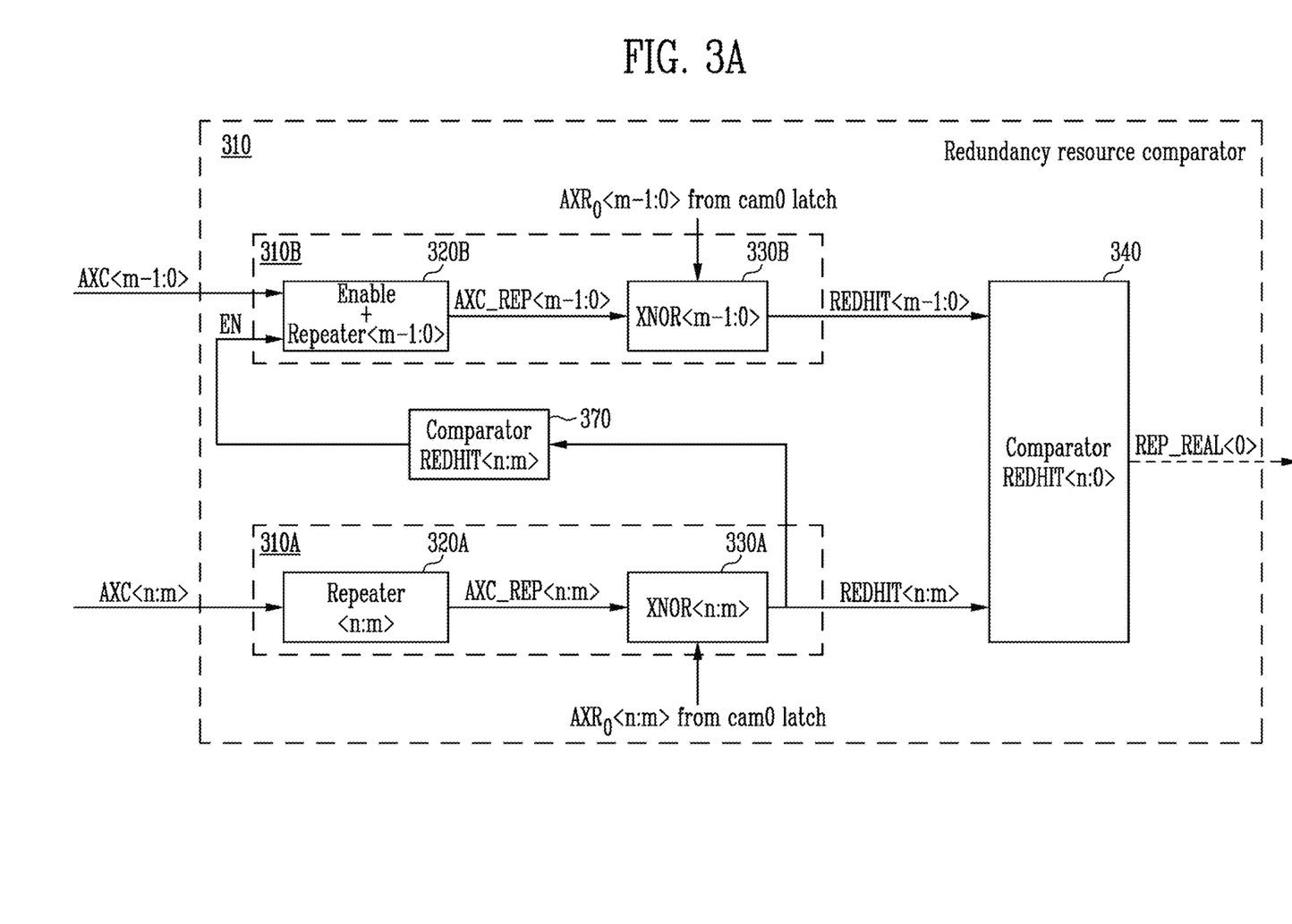
FIGS. 3A-3C show different portions of a bus architecture according to an embodiment of the present disclosure.

FIG. 3A schematically shows a portion of a bus architecture for a memory device according to an embodiment of the present disclosure, namely a redundancy resource comparator of the bus architecture, globally indicated as 310.

Figure 3B:
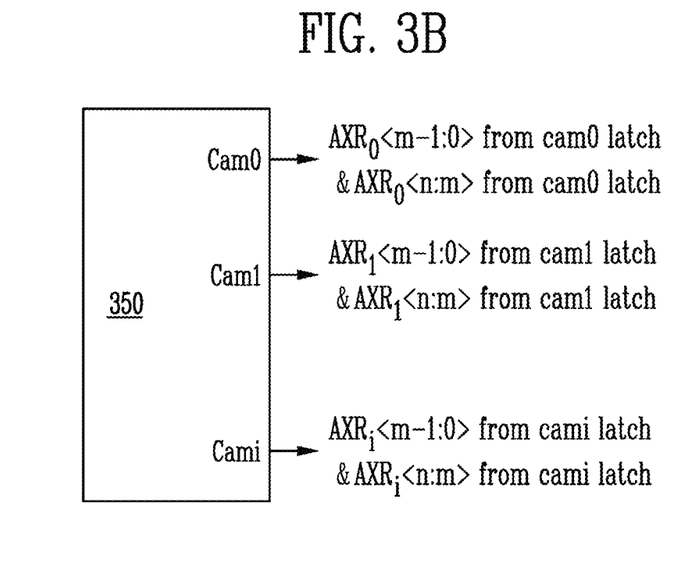

The redundancy resource comparator 310 comprises a first resource block 310A and a second resource block 310B receiving the address signal AXC from a linear address counter and a redundancy address AXR stored inside a latch 350 of the memory device, being shown in FIG. 3B.

More particularly, the first resource block 310A and second resource block 310B compare respective portions of bits of the address signal AXC, being received from an address signal bus, with respective portions of bits of the redundancy address AXR, being received from the latch 350 storing the redundancy address AXR, and are connected to an output comparator block 340 providing a final signal REP_REAL <0>, which is to be provided to a common encoder block (not shown in FIG. 3A).

Suitably, the first resource block 310A comprises a repeater 320A having an input connected to an address signal bus and receiving a first portion of bits of the address signal AXC<n:m> and providing a repeated address signal AXC_REP<n:m> (corresponding to the address signal AXC<n:m>) to a comparator block 330A, also receiving a corresponding first portion of bits of the redundancy address AXR<n:m> from the latch 350. The comparator block 330A of the first resource block 310A provides at an output terminal a first partial output result signal REDHIT<n:m>, which goes high when the bits of the first portion of the address signal AXC<n:m> and the corresponding bits of the first portion of the redundancy address AXR<n:m> have the same values.

Suitably, the first partial output result signal REDHIT<n:m> is also send to a further comparator 370, being able to provide an enable signal EN to the second resource block 310B, the enable signal EN going high when the bits of the first portion of the address signal AXC<n:m> and the corresponding bits of the first portion of the redundancy address AXR<n:m> have the same values, similar as the first partial output result signal REDHIT<n:m>.

Figure 3C:
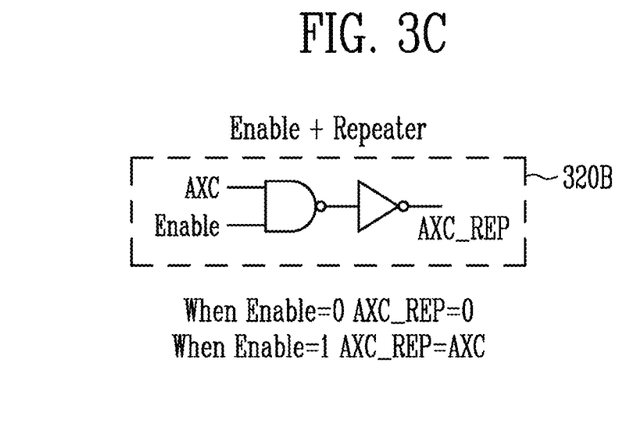

The second resource block 310B in turn comprises an enabling and repeater block 320B, which receives a second portion of bits of the address signal AXC<m-1:0> and the enable signal EN, and provides a repeated address signal AXC_REP<m-1:0> (corresponding to the address signal AXC<m-1:0>) to a comparator block 330B only when the enable signal EN goes high, as schematically shown in FIG. 3C. The comparator block 330B of the second resource block 310B also receives a corresponding second portion of bits of the redundancy address AXR<m-1:0> from the latch 350 and provides at an output terminal a second partial output result signal REDHIT<m-1:0>, which goes high when the bits of the second portion of the address signal AXC<m-1:0> and the corresponding bits of the second portion of the redundancy address AXR<m-1:0> have the same values.

The first partial output result signal REDHIT<n:m> and the second partial output result signal REDHIT<m-1:0> are provided to the output comparator block 340 providing the final signal REP_REAL <0>, which goes high when all bits of the first and second portions of the address signal AXC and of the redundancy address AXR have the same values.

More particularly, the first portions of bits of the address signal AXC<n:m> and of the redundancy address AXR<n:m> are the most significant bits which have the lowest switching activity. The matching of these most significant bits is thus used to enable the comparison of the second portion of bits of the address signal AXC<m-1:0> and of the redundancy address AXR<m-1:0>, that correspond to the lowest significant bits which have the highest switching activity.

Figure 4:
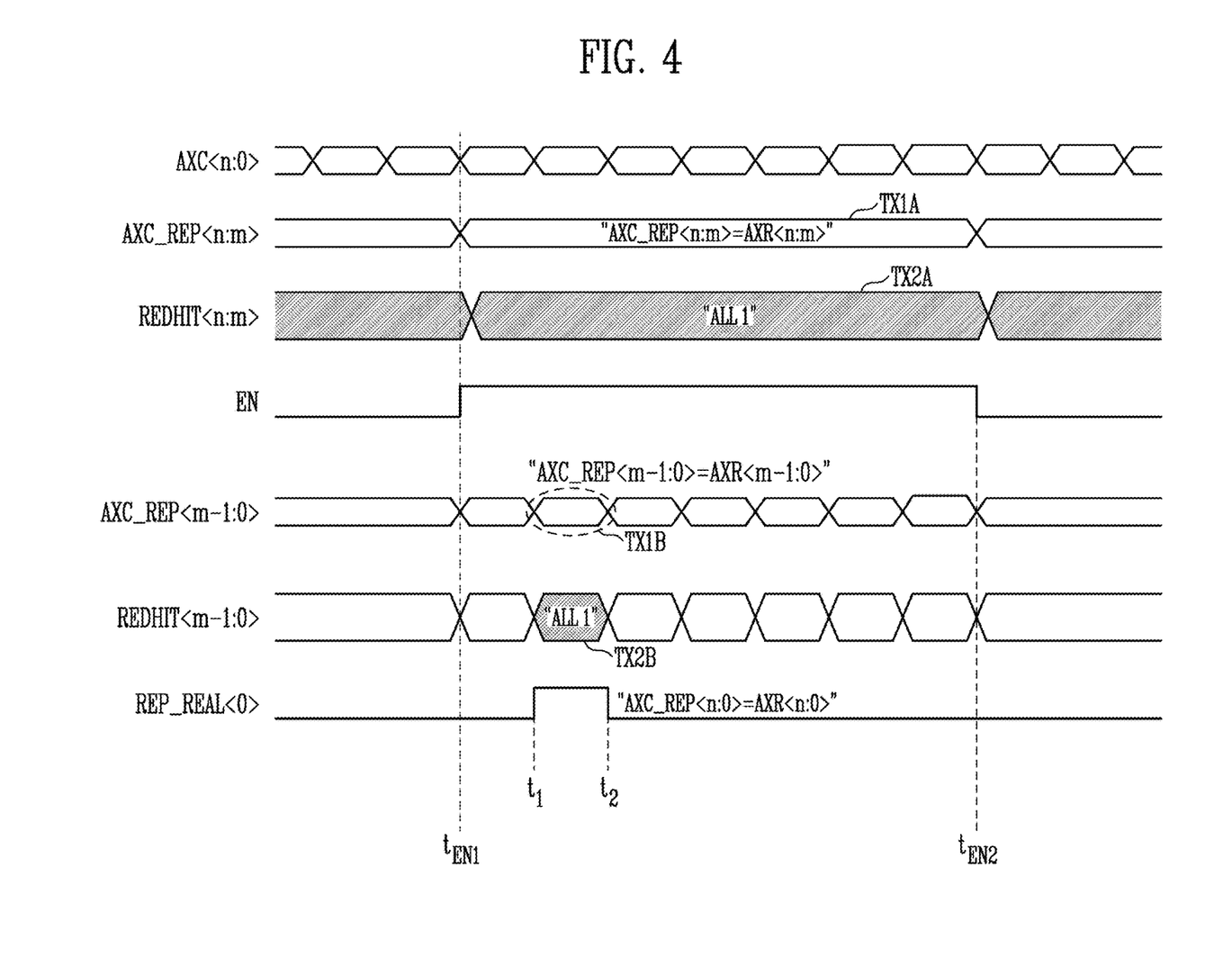
FIG. 4 shows internal signal signals of bus architecture of FIG. 3A.

In this way, the bus architecture according to the present disclosure, comprising the redundancy resource comparator 310 as shown in FIG. 3A, allows to limit the highest switching activity and the related power consumption inside a short time window, in particular the one enabled by an enable signal EN being high, as shown in FIG. 4.

In particular, when the first portion of bits of the address signal AXC<n:m>, and thus of the corresponding repeated address signal AXC_REP<n:m>, matches the first portion of bits of the redundancy address AXR<n:m> (AXC_REP<n:m>=AXR<n:m>) at a first transaction TX1A, all bits of the first partial output result signal REDHIT<n:m> goes high (ALL 1) at a second transaction TX2A and the corresponding enable signal EN goes high from time tEN1 to time tEN2, enabling the comparison between the bits of the second portions of the address signal AXC and of the redundancy address AXR by the second resource block 310B.

In this case, when the second portion of bits of the address signal AXC<m-1:0>, and thus of the corresponding repeated address signal AXC_REP<m-1:0>, matches the second portion of bits of the redundancy address AXR<m-1:0> (AXC_REP<m-1:0>=AXR<m-1:0>) at a third transaction TX1B, all bits of the second partial output result signal REDHIT<m-1:0> goes high (ALL 1) at a fourth transaction TX2B and the final signal bit REP_REAL <0> goes high during the transaction interval between t1 and t2, in case of a total match (AXC_REP<n:0>=AXR<n:0>).

According to an alternative embodiment of the present disclosure, not shown in the figures, the redundancy resource comparator 310 comprises more than two resource blocks, in particular k resource blocks, being k>2; in this case, the redundancy resource comparator 310 comprises k−1 further comparators providing k−1 enable signals. In this case, the redundancy resource comparator 310 provides for k comparisons between k portions of bits of the address signal AXC and of the redundancy address AXR.

Figure 5:
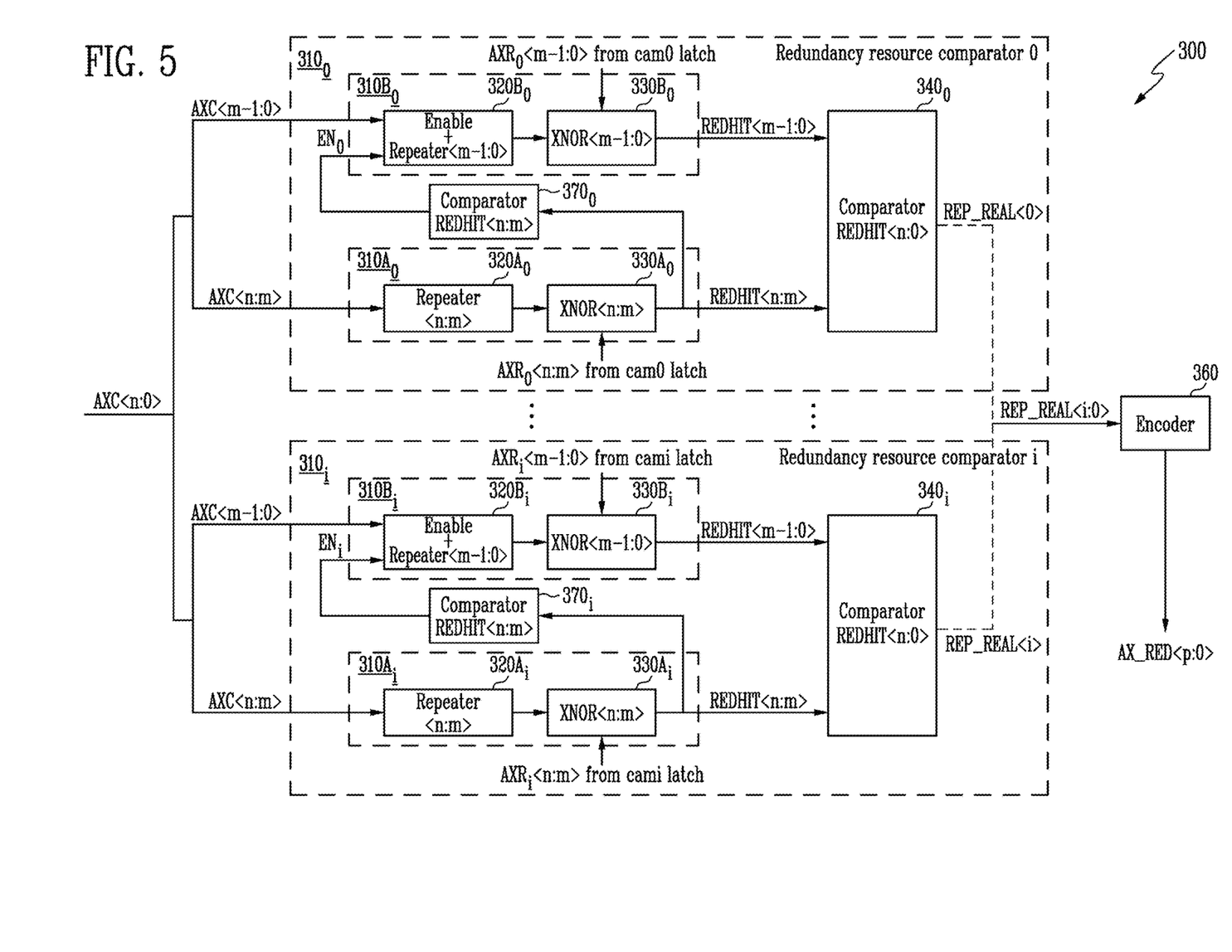
FIG. 5 shows a bus architecture according to an embodiment of the disclosure comprising the portion of FIG. 3A.

Starting from the redundancy resource comparator 310, a bus architecture according to the present disclosure comprising i number of redundancy resources comparators is obtained, as shown in FIG. 5, globally indicated as 300.

More particularly, the redundancy address comparison bus architecture 300 comprises i number of redundancy resources comparators $310_0, \ldots, 310_i$, each redundancy resource comparator 310 being realised as the one shown in FIG. 3A and comparing an address signal AXC<n:0> from a linear address counter and a redundancy address $AXR_0$<n:0>, $AXR_i$<n:0>, stored inside a latch 350 (as shown in FIG. 3B) of the memory device.

As above described, the redundancy resource comparators $310_0, \ldots, 310_i$ comprise respective first resource blocks $310A_0, \ldots, 310A_i$ and second resource blocks $310B_0, \ldots, 310B_i$ connected to a first portion of bits of the address signal AXC<n:m> and a second portion of bits of the address signal AXC<m-1:0> provided through respective repeaters $320A_0, \ldots, 320A$, and $320B_0, \ldots, 320B_i$, to respective comparator blocks $330A_0, \ldots, 330A_i$ and $330B_0, \ldots, 330B_i$, in turn providing first and second partial output result signals REDHIT<n:m> and REDHIT<m-1:0> to an output comparator block 340, which is able to provide a final signal REP_REAL <i:0> to a common encoder block 360 in turn providing a binary code address AX_RED<p:0>.

As described, the first partial output result signal REDHIT<n:m> is also sent to respective further comparators $370_0, \ldots, 370_i$, each being able to provide an enable signal EN to a respective second resource block $310B_0, \ldots, 310B_i$.

In this way, the redundancy address comparison bus architecture 300 is able to provide the binary code address AX_RED<p:0> related to the position number (from 0 to i) of the redundancy resource comparators $310_0, \ldots, 310_i$, of which the redundancy address $AXR_0$<n:0>, $\ldots$, $AXR_i$<n:0> matches with the AXC<n:0> from linear counter.

Suitably, a portion of bits of the address signal AXC and a corresponding portion of bits of the redundancy signal AXR are first compared against each other, and the remaining bits of the address signal AXC and of the redundancy address AXR are compared in response to an enable signal EN generated when, as a result of the first comparison, the corresponding portions of bits match each other.

In this way, the redundancy address comparison bus architecture 300 performs a two step comparison method for comparing an address signal AXC and a redundancy address AXR comprising the following operations:
  subdividing the address signal AXC and the redundancy address AXR into respective first portion of bits AXC<n:m>, AXR<n:m> and second portion of bits AXC<m-1:0>, AXR<m-1:0>;
  comparing the first portion of bits of the address signal AXC<n:m> with the first portion of bits of the redundancy address AXR<n:m> and generating an enable signal EN when all bits match each other; and
  comparing the second portion of bits of the address signal AXC<m-1:0> and the second portion of bits of the redundancy address AXR<m-1:0> only when the enable signal EN goes high.

The method further comprises an operation of:
  providing a final signal REP_REAL <0> which goes high (ALL 1) when all bits of the first and second portions of bits of the address signal AXC<n:0> matches with the respective bits of the first and second portions of bits of the redundancy address AXR<n:0>.

Finally, the method comprises an operation of providing a binary code address AX_RED<p:0> for the memory device based on the final signal REP_REAL <0>, the binary code address corresponding to the position number (from 0 to i) of redundancy resource comparator $3100, \ldots, 310i$, that matched its own redundancy address $AXR_0$<n:0>, $\ldots$, $AXR_i$<n:0> with AXC<n:0> from linear counter.

In this way, the redundancy address comparison bus architecture 300 is able to avoid unnecessary power consumption due to a comparing operation as performed by the known architectures on all bits when portions of the bits do not match each other.

Figure 6:
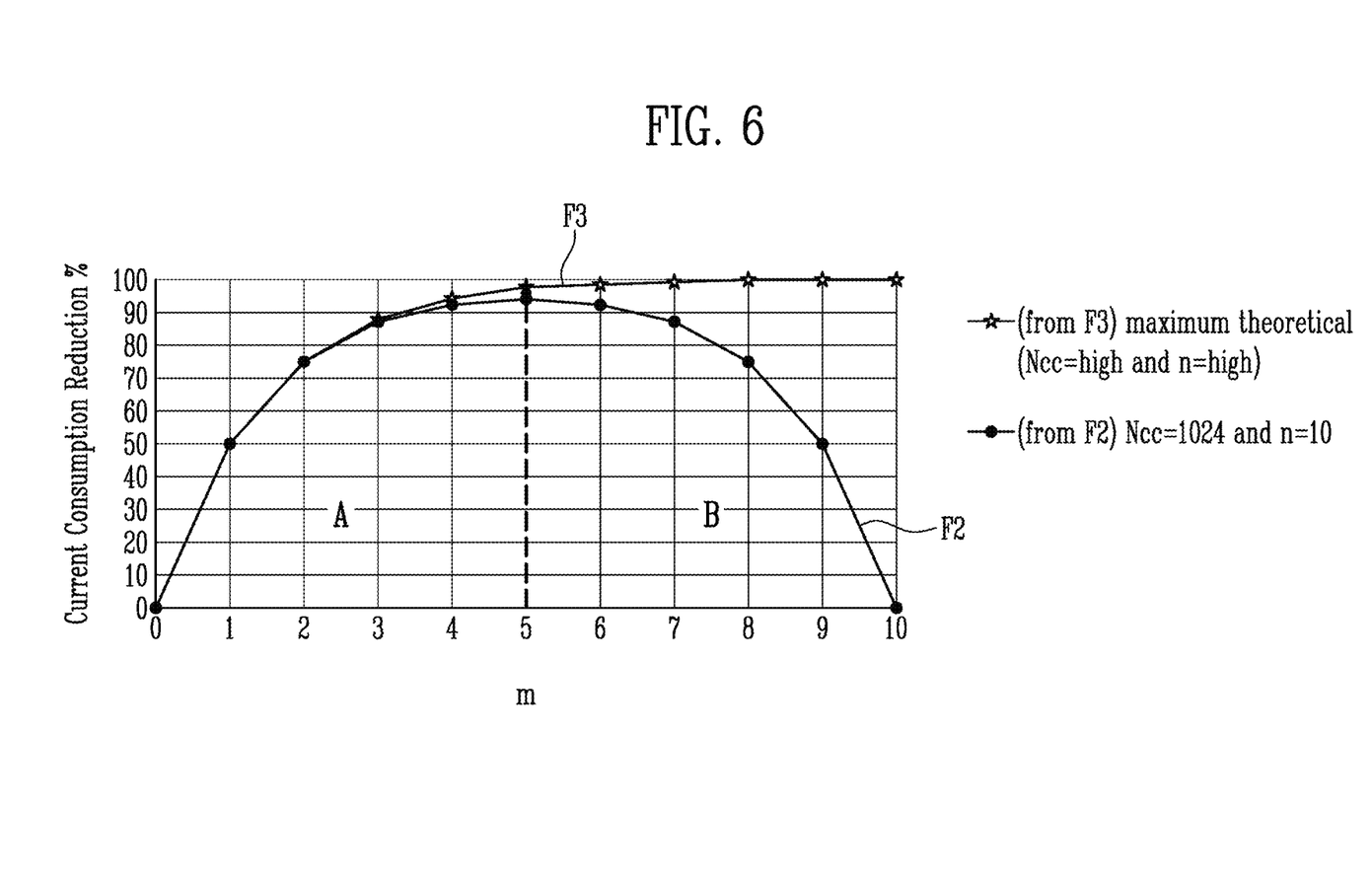
FIG. 6 shows a comparison between current consumptions of different bus architecture.

In particular, the reduction of the current consumption is shown in FIG. 6, by way of an example wherein n=10 and the total bit number NCC=1024, m being the number of less significant bits compared only when the enable signal EN is high.

It can be verified that with m=3, the new current consumption Idnew of each redundancy resource comparator 310 can be approximated calculated as
  for the curve F2: Idnew=0.251CVf0; and
  for the curve F3: Idnew=0.25CVf0,
  wherein F2 corresponds to a real case of n=10 and NCC=1024 while F3 corresponds to the maximum theoretical value considering lowest significant bits part always disable, when NCC is high and N is high, the value of Idnew for the exact curve F2 and the theoretical curve F3 being very similar for $2^m$<<NCC.

Moreover, curve F2 defines two regions depending on the number m of its filtered out bits by the two operation comparison method as above described:
  a region A, wherein $2^m$<<NCC and the current consumption reduction % for the exact curve F2 and the theoretical curve F3 are very similar; and
  a region B, wherein $2^m$ approaches NCC and the current consumption reduction % for the exact curve F2 and the theoretical curve F3 diverge.

It should be remarked that:
  m=0 corresponds to the traditional method (so, no current consumption reduction); and
  m=10 corresponds to no counting bits filtered out in NCC=1024 counting, hence no current consumption reduction with respect to a traditional method is obtained as well.

It can be thus verified that for the above indicated example, in case m=3, the redundancy address comparison bus architecture 300 implementing the method according to the present disclosure allows to obtain a current consumption reduction=87.5%.

If $2^m \ll NCC$, the current consumption reduction percentage $\Delta Id$ % is equal to $$\Delta Id\ \% = (Id - Idnew)/Id \cdot 100 = (1 - 1/2^m) \cdot 100,$$

where Id and Idnew are the current consumptions of a traditional redundancy resource comparator and of the proposed redundancy resource comparator and m is the number of less significant bits compared only when EN signal is high.

Figure 7A:
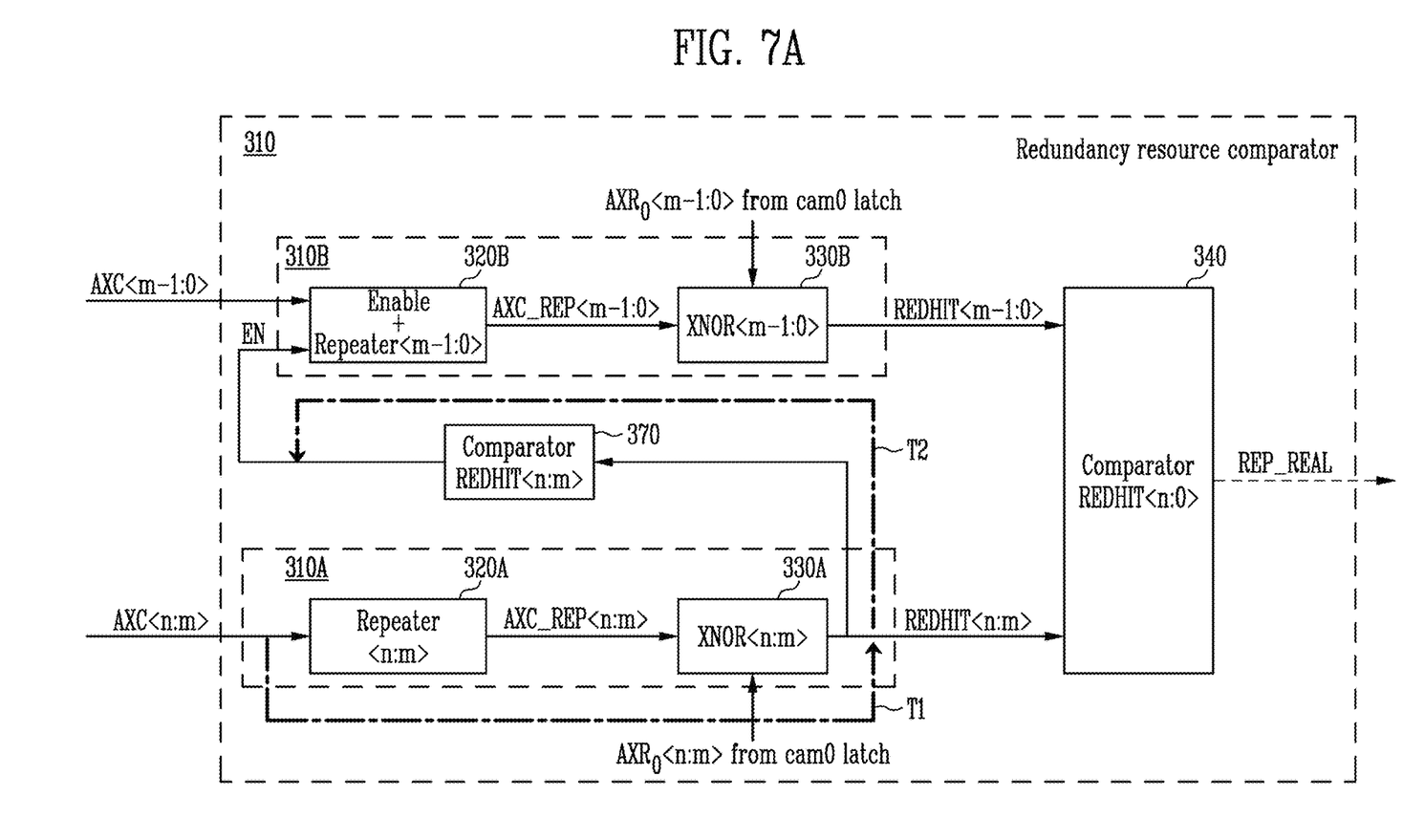
FIGS. 7A-7C show different portions of the bus architecture of FIG. 5.
Figure 7B:
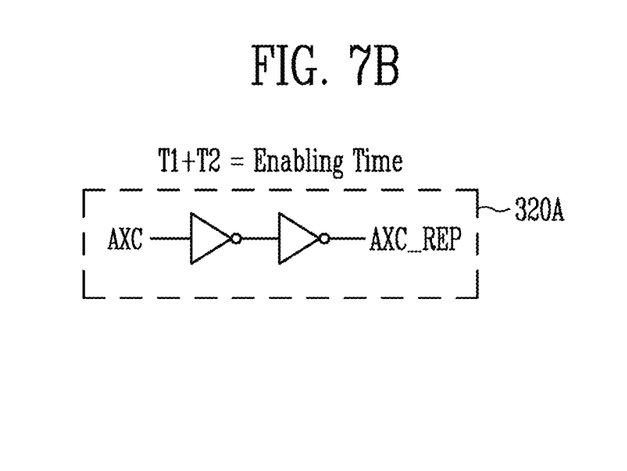
Figure 7C:
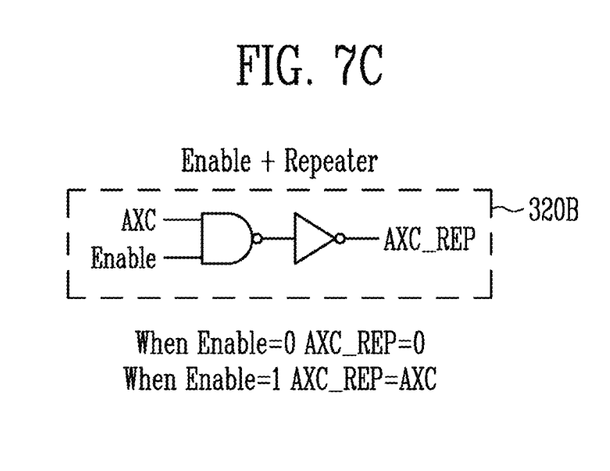

It is underlined that the timing performance of the redundancy address comparison bus architecture 300 and in particular of the redundancy resource comparators 310 comprised therein is only slightly different with respect to the known solution, as shown schematically in FIGS. 7A-7C.

In particular, the redundancy address comparison bus architecture 300 shows an enabling time T1+T2 delaying the comparison operation as a whole, due to the first partial bits comparison made by the first resource block 310A (T1) and the generation of the enable signal EN by the further comparator 370 to allow the second partial bits comparison by the second resource block 310B (T2).

Figure 8A:
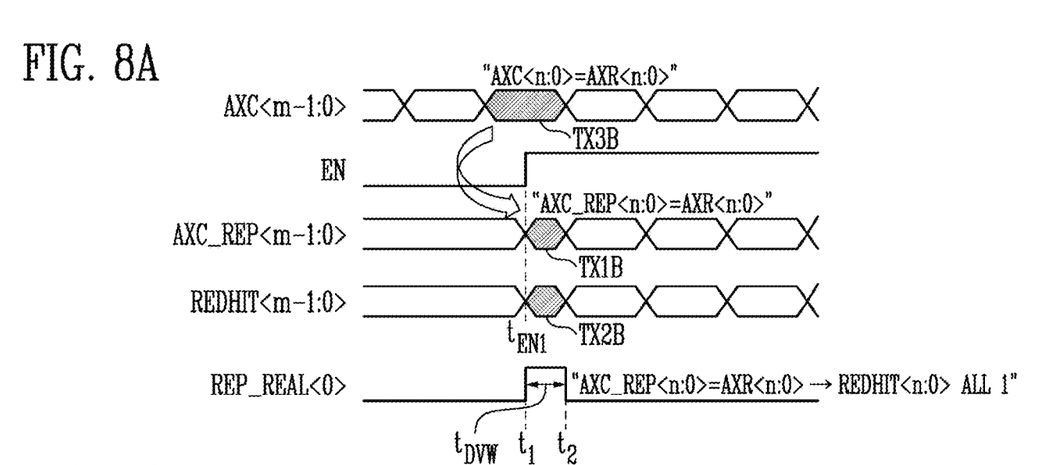
FIGS. 8A-8C show internal signals of the bus architecture of FIG. 5 according to different working modes thereof.
Figure 8B:
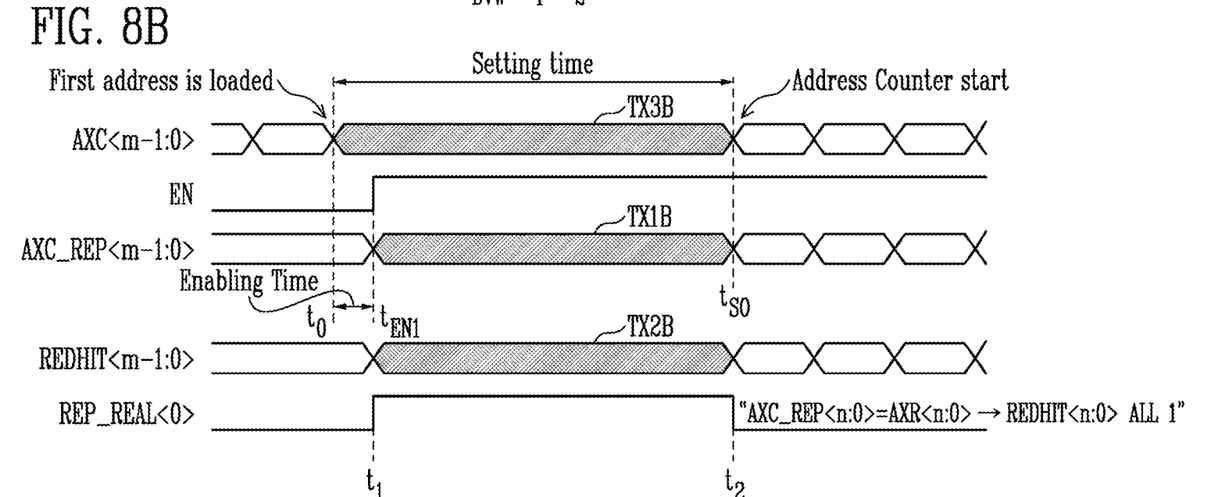
Figure 8C:
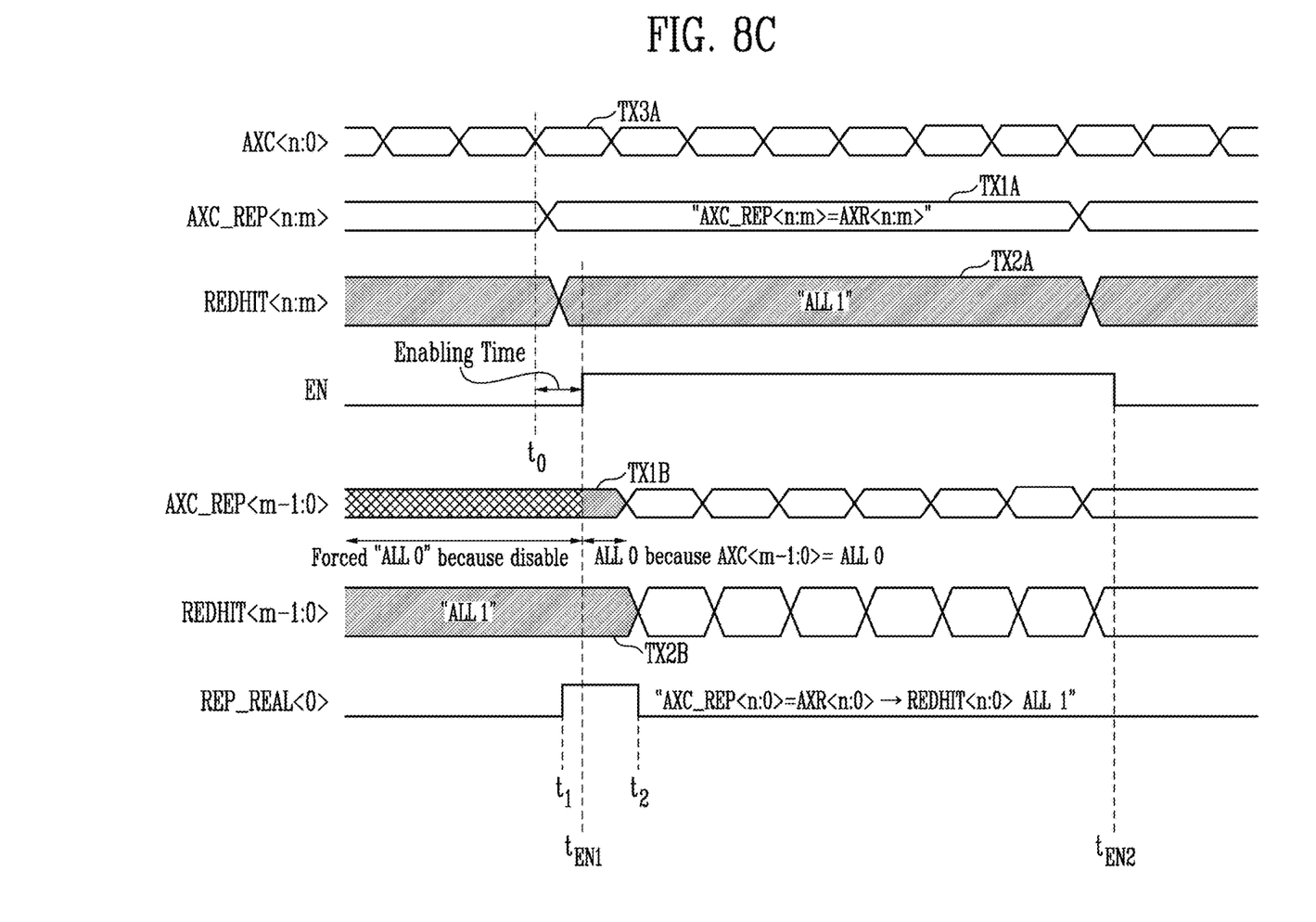

More particularly, making reference to FIGS. 8A-8C, it can be verified that between the matching of the address signal AXC and of the redundancy address AXR (AXC<n:0>=AXR<n:0>) at a transaction TX3B and the comparison of the second portions of bits AXC<m-1:0> and AXR<m-1:0>, a delay time occurs due to the enable signal EN going high at an enabling time tEN1.

In fact, if AXR<n:0>=AXC<n:0> at the first address after the enable signal EN goes high (after the enabling time tEN1), the second portion of bits of the repeated address signal AXC_REP<m-1:0> can be cut and the resulting data valid window for the second partial output result signal REDHIT<m-1:0> and final signal bit REP_REAL<0>, indicated as tDVW in FIG. 8A, is reduced, However, it can be verified that the overall timing performance of the redundancy address comparison bus architecture is not really affected by the implemented two operation comparison method.

In fact, it is clear that the enable signal EN could go high in two different cases and in particular:

a) at the first address of the counter; and
b) during address counting.

In the first case, when the enable signal EN goes high at an initial time t0 when the first address of the counter is loaded, it can be verified that between the load of the first address and the start of the counting, i.e. a time tS0 when the address counter starts, a setting time is always guaranteed from technical specification, as indicated in FIG. 8B.

It is thus clear that the enabling time tEN1 is negligible compared to the setting time, so the time performance of the redundancy address comparison bus architecture and of the redundancy resource comparator as a whole is not impacted.

Alternatively, in the second case as indicated in FIG. 8C, the enable signal EN goes high during the address counting, in particular when the first portion of bits of the address signal AXC<n:m> changes and matches the first portion of bits of the redundancy address AXR<n:m> at the transaction TX1A; however, within the linear counter, the address signal AXC can change only when the second portion of bits that corresponding to the lowest significant bits of the address signal AXC<m-1:0> passes from ALL 1 to ALL 0, which is the forced value when the comparison is disabled, i.e. before the enable signal EN goes high; it is thus clear that the first value of the second portion of bits of the address signal AXC<m-1:0> after the enable signal EN goes high, i.e. during the transaction portion TX1B, is always ALL 0.

In other words, during the address counting, the value of the second portion of bits of the address signal AXC<m-1:0> after the enable signal EN goes high, can be only ALL 0.

In this way, the effect of the enable signal EN on the second portion of bits of the repeated address signal AXC_REP<m-1:0> is hidden because the second portion of bits of the repeated address signal AXC_REP<m-1:0> passes from ALL 0 when disabled to ALL 0 when enabled and the second portion of bits of the address signal AXC<m-1:0>=ALL 0.

Also in this case, it can be thus verified that the time performance of the redundancy resource comparators and of the redundancy address comparison bus architecture as a whole is not impacted.

The redundancy address comparison bus architecture according to the embodiments of the present disclosure is thus able to reduce the current consumption of the comparison between the address signal and the redundancy address with respect to the known architectures by enabling the high switching activity signals path only when it needs to use the comparison of the lower switching activity signals to enable the high switching activity signals comparison.

Moreover, the timing performances of the redundancy address comparison bus architecture according to the embodiments of the present disclosure are not affected by the implemented two operations comparison method.

From the foregoing it will be appreciated that, although specific embodiments of the invention have been described herein for purposes of illustration, various modifications may be made without deviating from the spirit and scope of the invention. Accordingly, the invention is not limited except by the appended claims.

What is claimed is:

1. A redundancy resource comparator for a bus architecture of a memory device for comparing an address signal from an address signal bus and a redundancy address stored in the memory device, the redundancy resource comparator comprising:

a first resource block configured to receive a first portion of bits of the address signal and a first portion of bits of the redundancy address;

a second resource block configured to receive a second portion of bits of the address signal and a second portion of bits of the redundancy address; and a further comparator configured to provide an enable signal to the second resource block in response to a first partial output result signal from the first resource block, wherein the first resource block includes:

a repeater configured to receive a first portion of bits of a repeated address signal corresponding to the first portion of bits of the address signal; and a comparator block configured to provide the first partial output result signal corresponding to a comparing result of the first portion of bits of the repeated address signal and the first portion of bits of the redundancy address, wherein the second resource block includes:

an enabling and repeater block configured to provide a second portion of bits of a repeated address signal corresponding to second portion of bits of the address signal in response to the enable signal; and a further comparator block configured to provide a second partial output result signal corresponding to a comparing result of the second portion of bits of the repeated address signal and the second portion of bits of the redundancy address,
wherein the first partial output result signal goes high when the bits of the first portion of the address signal and the corresponding bits of the first portion of the redundancy address have the same value, and
wherein the second partial output result signal goes high when the bits of the second portion of the address signal and the corresponding bits of the second portion of the redundancy address have the same value.

2. The redundancy resource comparator of claim 1, further comprising:
an output comparator block configured to be coupled to the first resource block and second resource block.

3. The redundancy resource comparator of claim 1, further comprising: an output comparator block configured to receive the first partial output result signal and the second partial output result signal and to provide a final signal,
wherein the final signal goes high when both the first partial output result signal and the second partial output result signal go high.

4. The redundancy resource comparator of claim 1, wherein the first portions of bits of the address signal and of the redundancy address are the most significant bits.

5. The redundancy resource comparator of claim 1, wherein the first portions of bits of the address signal and of the redundancy address are the bits having the lowest switching activity.

6. The redundancy resource comparator of claim 1, further comprising: k resource blocks and k−1 comparators, where k>2 and the k−1 comparators providing k−1 enable signals, each resource block receiving one enable signal from previous resource block and one of k portions of bits of the address signal and of the redundancy address.

7. A redundancy address comparison bus architecture for a memory device comparing an address signal from an address signal bus and a redundancy address stored in the memory device, the redundancy address comparison bus architecture including i number of redundancy resources comparators, each redundancy resource comparator comprising:
a first resource block, receiving a first portion of bits of the address signal and a first portion of bits of the redundancy address and including:
a repeater receiving the first portion of bits of the address signal and providing a first portion of bits of a repeated address signal, corresponding to the first portion of bits of the address signal, and
a comparator block receiving the first portion of bits of the repeated address signal and the first portion of bits of the redundancy address and providing a first partial output result signal,
wherein the first partial output result signal goes high when the bits of the first portion of the address signal and the corresponding bits of the first portion of the redundancy address have the same value;
a second resource block receiving a second portion of bits of the address signal and a second portion of bits of the redundancy address, the second resource block including:
an enabling and repeater block receiving the second portion of bits of the address signal and an enable signal and providing a second portion of bits of a repeated address signal, corresponding to second portion of bits of the address signal, when the enable signal goes high, and
a further comparator block receiving the second portion of bits of the repeated address signal and the second portion of bits of the redundancy address and providing a second partial output result signal,
wherein the second partial output result signal goes high when the bits of the second portion of the address signal and the corresponding bits of the second portion of the redundancy address have the same value; and
a further comparator receiving the first partial output result signal from the first resource block and providing the enable signal to the second resource block, the enable signal going high when the bits of the first portion of the address signal and the corresponding bits of the first portion of the redundancy address have the same value.

8. The redundancy address comparison bus architecture of claim 7, wherein the first resource block and second resource block of each redundancy resource comparator are connected to an output comparator block receiving the first partial output result signal and the second partial output result signal and providing a final signal for a common encoder block of the memory device, the final signal going high when all bits of the first and second portions of the address signal and of the redundancy address have the same value, the common encoder block in turn providing a binary code address, the binary code address corresponding to the position number of redundancy resource comparator of which the redundancy address matches with address signal from a linear counter.

9. The redundancy address comparison bus architecture of claim 7, wherein the first portions of bits of the address signal and of the redundancy address are the most significant bits.

10. The redundancy address comparison bus architecture of claim 7, wherein the first portions of bits of the address signal and of the redundancy address are the bits having the lowest switching activity.

11. The redundancy address comparison bus architecture of claim 7, wherein each redundancy resource comparator comprises k resource blocks and k−1 comparators, where k>2; and the k−1 further comparators providing k−1 enable signals, each resource block receiving one enable signal from previous further comparator and one of k portions of bits of the address signal and of the redundancy address.

12. A method for comparing an address signal and a redundancy address, the method comprising:
comparing a first portion of bits of the address signal with a first portion of bits of the redundancy address and generating an enable signal when all bits of the first portion of bits of the address signal and all bits of the first portion of bits of the redundancy address match each other;
comparing a second portion of bits of the address signal and a second portion of bits of the redundancy address when the enable signal goes high; and
providing a final signal, the final signal going high when all bits of the first portion and the second portion of bits of the address signal match with the respective bits of the first portion and the second portion of bits of the redundancy address.

13. The method of claim 12, further comprising:
providing a binary code address based on the final signal, the binary code address corresponding to the position number of redundancy resource comparator of which the redundancy address matches with address signal from a linear counter.

14. The method of claim 12, wherein the first portions of bits of the address signal and of the redundancy address are the most significant bits.

15. The method of claim 12, wherein the first portions of bits of the address signal and of the redundancy address are the bits having the lowest switching activity.

* * * * *